us009176172B2

(12) United States Patent
Liao

(10) Patent No.: US 9,176,172 B2
(45) Date of Patent: Nov. 3, 2015

(54) POWER LEVEL IDENTIFICATION CIRCUIT, POWER LEVEL FLAG CIRCUIT AND POWER LEVEL SUPPLY SYSTEM

(71) Applicant: HON HAI PRECISION INDUSTRY CO., LTD., New Taipei (TW)

(72) Inventor: Ming-Yu Liao, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 214 days.

(21) Appl. No.: 14/011,748

(22) Filed: Aug. 27, 2013

(65) Prior Publication Data

US 2014/0333288 A1 Nov. 13, 2014

(30) Foreign Application Priority Data

May 10, 2013 (TW) .............................. 102116600 A

(51) Int. Cl.
| | |
|---|---|
| *G01R 19/00* | (2006.01) |
| *G01R 21/00* | (2006.01) |
| *G01R 21/133* | (2006.01) |
| *G01R 21/10* | (2006.01) |
| G01R 22/00 | (2006.01) |
| G01R 35/04 | (2006.01) |

(52) U.S. Cl.
CPC .............. *G01R 21/133* (2013.01); *G01R 21/00* (2013.01); *G01R 21/005* (2013.01); *G01R 21/006* (2013.01); *G01R 21/10* (2013.01); G01R 19/00 (2013.01); G01R 22/00 (2013.01); G01R 35/04 (2013.01)

(58) Field of Classification Search
CPC .... G01R 21/00; G01R 21/005; G01R 21/006; G01R 21/10; G01R 21/133; G01R 22/00; G01R 35/04; G01R 19/00; G01R 19/0084; G01R 19/0092

USPC ...... 324/76.11, 103 R, 103 P, 120; 702/1, 57, 702/60

See application file for complete search history.

(56) References Cited

U.S. PATENT DOCUMENTS

| | | | | |
|---|---|---|---|---|
| 5,370,602 A | * | 12/1994 | Kepley ........................... | 606/128 |
| 5,656,929 A | * | 8/1997 | Humpherys .................... | 324/95 |

(Continued)

FOREIGN PATENT DOCUMENTS

| | | |
|---|---|---|
| CN | 2777559 | 5/2006 |
| CN | 102215113 | 10/2011 |

(Continued)

*Primary Examiner* — Hoai-An D Nguyen
(74) *Attorney, Agent, or Firm* — Novak Druce Connolly Bove + Quigg LLP

(57) ABSTRACT

A power level identification circuit includes a power interface, a voltage conversion unit, a waveform detection unit, a signal pre-processing unit and a processing unit. The power interface receives electrical power and first signals indicating a level of the power. The voltage conversion unit receives the power from the power interface and converts the power. The waveform detection unit filters the power and obtains the first signals indicating power level. The signal pre-processing unit shapes the waveform of the first signals indicating power level and thereby generates second signals indicating power level. The processing unit identifies a level of the second signals indicating power level and switches to one of modes of the power level identification circuit corresponding to the identified level of the second signals indicating power level. A power level flag circuit and a power level supply system are also provided.

19 Claims, 3 Drawing Sheets

(56) References Cited

U.S. PATENT DOCUMENTS

| | | |
|---|---|---|
| 7,283,070 B1 | 10/2007 | Roy et al. |
| 7,745,954 B1 * | 6/2010 | Menas ............... 307/38 |
| 2003/0117821 A1 * | 6/2003 | Amels et al. ............ 363/124 |
| 2007/0258542 A1 * | 11/2007 | Cleveland ............... 375/296 |
| 2009/0049315 A1 | 2/2009 | Diab et al. |
| 2010/0279606 A1 | 11/2010 | Hillan et al. |
| 2013/0018519 A1 | 1/2013 | Lin |
| 2014/0039821 A1 * | 2/2014 | Audet ............... 702/66 |

FOREIGN PATENT DOCUMENTS

| | | |
|---|---|---|
| TW | 200929935 | 7/2009 |
| TW | 201304453 | 1/2013 |

* cited by examiner

POWER LEVEL IDENTIFICATION CIRCUIT, POWER LEVEL FLAG CIRCUIT AND POWER LEVEL SUPPLY SYSTEM

BACKGROUND

1. Technical Field

The disclosure relates to identification circuits and flag circuits, and particularly to power level identification circuits and power level flag circuits.

2. Description of Related Art

Different voltage or power adapters have similar appearances, and this can easily confuse people. When a small power supply adapter is used on an electronic device needing a large amount of power, or a large power supply adapter is used on an electronic device needing a small amount of power, damage may be caused to the electronic device. Accordingly, there is a need for a circuit that can identify or mark the level of power output by a power adapter.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the views.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references can mean "at least one."

Figure 1:
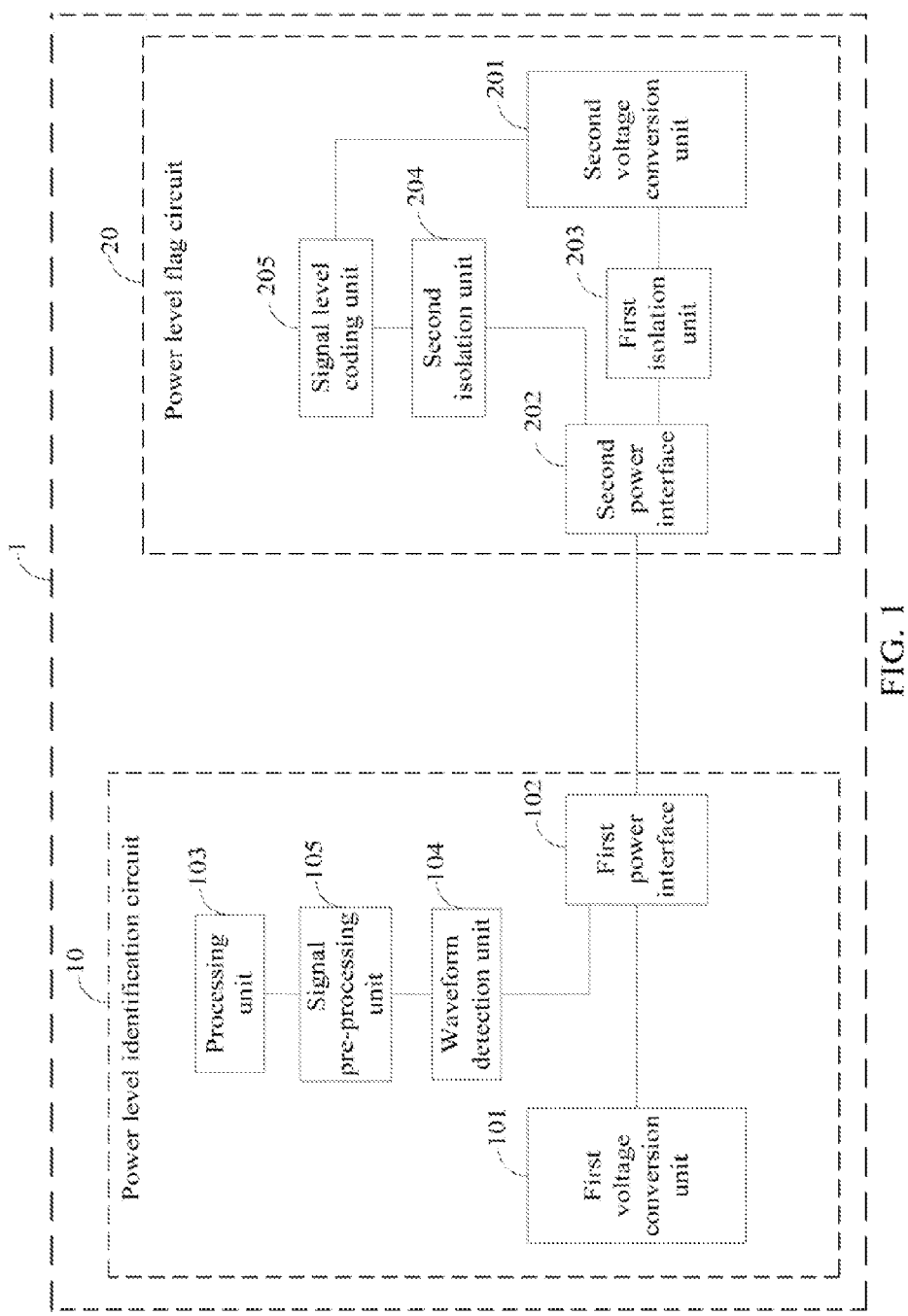
FIG. 1 is a schematic diagram of a first embodiment of a power level supply system according to the present disclosure, the system including a power level identification circuit and a power level flag circuit.

FIG. 1 is a schematic diagram of a first embodiment of a power level supply system 1 according to the present disclosure. In one embodiment, the power level supply system 1 comprises a power level identification circuit 10 and a power level flag circuit 20. In one embodiment, the power level identification circuit 10 comprises a first voltage conversion unit 101, a first power interface 102, a processing unit 103, a waveform detection unit 104, and a signal pre-processing unit 105. The power level identification circuit 10 provides different modes corresponding to different power levels. In this description, a "mode" can be a mode of the power level identification circuit 10; and unless the context indicates otherwise, a reference to a "level" is a reference to a power level.

In the present embodiment, "power level" is a predetermined measurable parameter of the electrical power received by the power level identification circuit 10. The predetermined measurable parameter may be any one of power (measured in watts), current (measured in amps), and voltage (measured in volts).

The first power interface 102 is connected to the first voltage conversion unit 101. The first power interface 102 receives electrical power and first signals indicating a level of the power.

The waveform detection unit 104 is connected to the first power interface 102. The waveform detection unit 104 filters the power in the first power interface 102 and obtains the first signals indicating power level.

The signal pre-processing unit 105 is connected between the processing unit 103 and the waveform detection unit 104. The signal pre-processing unit 105 shapes waveforms of the first signals indicating power level and thereby generates corresponding second signals indicating power level, and transmits the second signals indicating power level to the processing unit 103.

The processing unit 103 identifies a level of the second signals indicating power level, and switches to a mode corresponding to the identified level of the second signals indicating power level.

In one embodiment, the power level flag circuit 20 comprises a second voltage conversion unit 201, a second power interface 202, a first isolation unit 203, a second isolation unit 204 and a signal level coding unit 205. The second power interface 202 is connected to the second voltage conversion unit 201. The second power interface 202 receives the power from the second voltage conversion unit 201, and receives the first signals indicating power level from the signal level coding unit 205.

The signal level coding unit 205 is connected to the second voltage conversion unit 201. The signal level coding unit 205 identifies the level of the power output by the second voltage conversion unit 201, and generates the first signals indicating power level corresponding to the level of the power.

The first isolation unit 203 is connected between the second voltage conversion unit 201 and the second power interface 202. The first isolation unit 203 isolates the first signals indicating power level in the second power interface 202, so that the second voltage conversion unit 201 can supply the power via the second power interface 202.

The second isolation unit 204 is connected between the second power interface 202 and the signal level coding unit 205. The second isolation unit 204 isolates the power in the second power interface 202, so that the signal level coding unit 205 can transmit the first signals indicating power level via the second power interface 202.

In one embodiment, the first power interface 102 and the second power interface 202 can be in the form of mating round holes and plugs, mating universal serial bus (USB) connectors, or other suitable types of matching physical interfaces. The first power interface 102 and the second power interface 202 can be connected together, or can be disconnected from each other.

In one embodiment, the second voltage conversion unit 201 supplies the power to the power level flag circuit 20, and the first voltage conversion unit 101 supplies the power to the power level identification circuit 10 after obtaining the power from the second voltage conversion unit 201 via the first power interface 102 and the second power interface 202. The first voltage conversion unit 101 and the second voltage conversion unit 201 can be a known power modules that supply direct current (DC) power, i.e., power modules that already exist in current technology.

Figure 2:
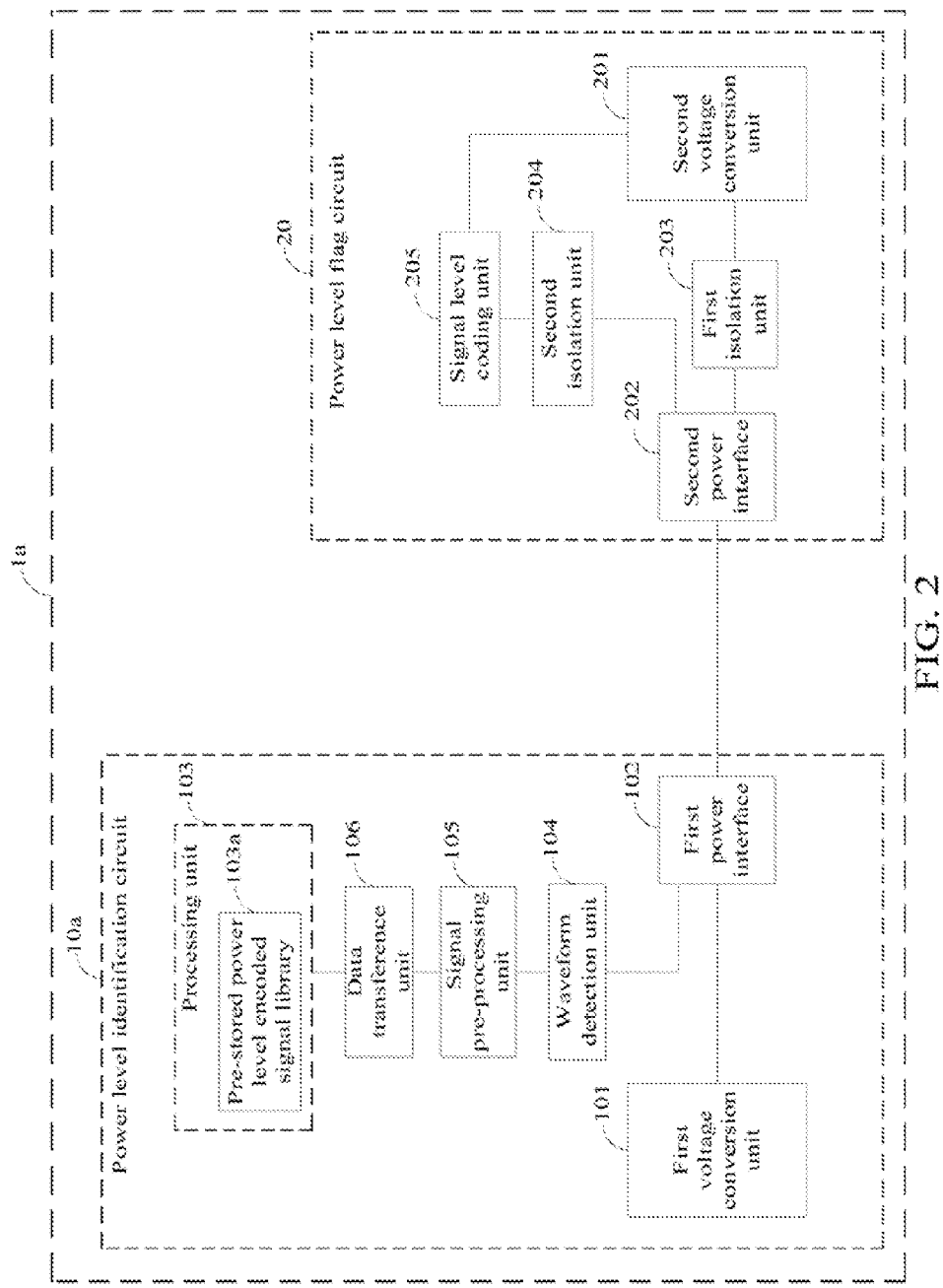
FIG. 2 is a schematic diagram of a second embodiment of a power level supply system according to the present disclosure, the system including a power level identification circuit and a power level flag circuit.

FIG. 2 is a schematic diagram of a second embodiment of a power level supply system 1a according to the present disclosure. The power level supply system 1a comprises a power level identification circuit 10a and the power level flag circuit 20. In one embodiment, the power level identification circuit 10a is similar to the power level identification circuit 10 of the first embodiment. The difference between the power level identification circuit 10a and the power level identification circuit 10 is that the power level identification circuit 10a further comprises a data transference unit 106 and a pre-stored power level encoded signal library 103a.

In one embodiment, the data transference unit 106 is connected between the signal pre-processing unit 105 and the processing unit 103. The data transference unit 106 receives and stores the second signals indicating power level output by the signal pre-processing unit 105. The processing unit 103 reads, and identifies the level of, the second signals indicating power level received from the data transference unit 106; and the processing unit 103 then switches to a mode corresponding to the level of the second signals indicating power level.

The pre-stored power level encoded signal library 103a is provided as part of the processing unit 103. The processing unit 103 identifies the level of the second signals indicating power level by searching for the level of the second signals indicating power level in the pre-stored power level encoded signal library 103a. Note also that, even though not illustrated, the processing unit 103 of the power level identification circuit 10 (FIG. 1) can comprise the pre-stored power level encoded signal library 103a. Similarly, the processing unit 103 of a power level identification circuit 10b (see below, and FIG. 3) can comprise the pre-stored power level encoded signal library 103a.

In other embodiments, the pre-stored power level encoded signal library 103a can be provided otherwise than as part of the processing unit 103.

Figure 3:
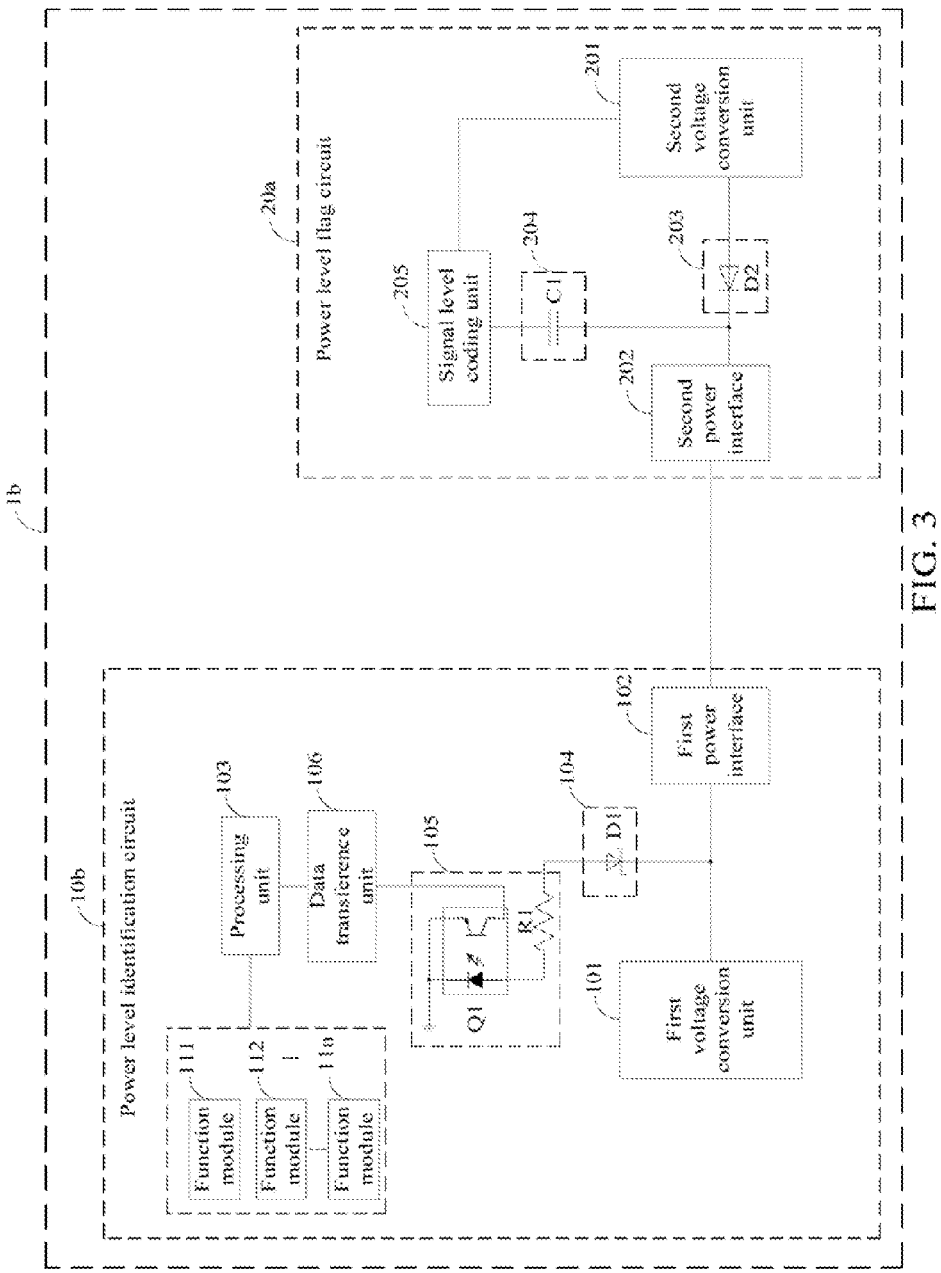
FIG. 3 is a circuit diagram of a third embodiment of a power level supply system according to the present disclosure, the system including a power level identification circuit and a power level flag circuit.

FIG. 3 is a circuit diagram of a third embodiment of a power level supply system 1b according to the present disclosure. The power level supply system 1b comprises the power level identification circuit 10b and a power level flag circuit 20a. In one embodiment, the power level supply system 1b is similar to the power level supply system 1a of the second embodiment. In the power level supply system 1b, the waveform detection unit 104 comprises a zener diode D1. An anode of the zener diode D1 is connected to the signal pre-processing unit 105, and a cathode of the zener diode D1 is connected to a node between the first voltage conversion unit 101 and the first power interface 102.

In one embodiment, the signal pre-processing unit 105 comprises a photoelectric sensor Q1 and a resistor R1. The photoelectric sensor Q1 comprises an input and an output. The input of the photoelectric sensor Q1 is connected between the anode of the zener diode D1 and ground, and the output of the photoelectric sensor Q1 is connected between the data transference unit 106 and ground. The input of the photoelectric sensor Q1 is an emitting end and comprises a light emitting diode. The output of the photoelectric sensor Q1 is a receiving end and comprises a phototransistor. The input of the photoelectric sensor Q1 and the output of the photoelectric sensor Q1 communicate through light. The photoelectric sensor Q1 transforms the changes of light intensity into electric signals to transmit signals. The resistor R1 is connected between the input of the photoelectric sensor Q1 and the anode of the zener diode D1.

In one embodiment, the first isolation unit 203 comprises a diode D2. An anode of the diode D2 is connected to the second voltage conversion unit 201, and a cathode of the diode D2 is connected to the second power interface 202. The second isolation unit 204 comprises a capacitor C1. A first end of the capacitor C1 is connected to the signal level coding unit 205, and a second end of the capacitor C1 is connected to a node between the second power interface 202 and the cathode of the diode D2.

In one embodiment, the first signals indicating power level transmitted in the first power interface 102 and the second interface 202 are square wave signals, and the power transmitted in the first power interface 102 and the second interface 202 is DC power. Reverse breakdown voltage of the zener diode D1 may be equivalent to voltage output by the second voltage conversion unit 201, so that the zener diode D1 filters the DC power in the first power interface 102 and obtains the first signals indicating power level, and the signal pre-processing unit 105 receives the first signals indicating power level from the zener diode D1. The signal pre-processing unit 105 shapes the waveforms of the first signals indicating power level output by the zener diode D1 according to the signal pre-processing unit 105 controlling the photoelectric sensor Q1 to turn on and turn off. The signal pre-processing unit 105 changes the first signals indicating power level into the second signals indicating power level, and thereby eliminates or at least mitigates problems associated with any distortion of the first signals indicating power level which occurs in the power level supply system 1b upstream of the signal pre-processing unit 105. Thereby, the second signals indicating power level received and stored by the data transference unit 106 and received and read by the processing unit 103 can accurately correspond to the first signals indicating power level output from the signal level coding unit 205. Accordingly, the second signals indicating power level identified by the processing unit 103 are accurate signals.

The diode D2 isolates the first signals indicating power level in the second power interface 202, so that the second voltage conversion unit 201 can supply power via the second power interface 202. The capacitor C1 isolates the power in the second power interface 202, so that the signal level coding unit 205 can transmit the first signals indicating power level via the second power interface 202.

In one embodiment, in order to make input voltage of the first voltage conversion unit 101 equivalent to output voltage of the second voltage conversion unit 201, a frequency of the first signals indicating power level should be far less than a frequency of the first voltage conversion unit 101, so that the first voltage conversion unit 101 can filter the first signals indicating power level in the first power interface 102.

In other embodiments, a filter circuit (not shown) can be added between the first voltage conversion unit 101 and the first power interface 102. The filter circuit (not shown) filters the first signals indicating power level in the first power interface 102, and supplies power to the first voltage conversion unit 101.

In one embodiment, the power level identification circuit 10b further comprises at least one function module 11$n$ (n=1, 2, . . . ,n). The at least one function module 11$n$ (n=1,2, . . . ,n) is connected to the processing unit 103. The at least one function module 11$n$ (n=1,2, . . . ,n) can be at least one power over Ethernet (POE) function module, or at least one other suitable function module. In the illustrated embodiment, the at least one function module 11$n$ (n=1,2, . . . ,n) is at least three function modules 111, 112, . . . , 11$n$. Note also that, even though not illustrated, the power level identification circuit 10 (FIG. 1) can further comprise the at least one function module 11$n$ (n=1,2, . . . ,n), and the power level identification circuit 10a (FIG. 2) can further comprise the at least one function module 11$n$ (n=1,2, . . . ,n).

In one embodiment, the processing unit 103 can be a central processing unit (CPU), or another suitable data processing chip.

In one embodiment, taking the power level identification circuit 10b as an example, in response to the processing unit 103 identifying the level of the second signals indicating power level, the processing unit 103 switches to a mode which corresponds to the identified level of the second signals indicating power level, to turn on or turn off the at least one function module 11n (n=1,2, . . . ,n), respectively, according to such mode. In one embodiment, different modes corresponding to different levels of the second signals indicating power level are included in the pre-stored power level encoded signal library 103a. In response to the processing unit 103 not identifying the level of the second signals indicating power level or not detecting the second signals indicating power level, the processing unit 103 suspends the working of the power level identification circuit 10b. For example, the processing unit 103 turns off the at least one function module 11n (n=1,2, . . . ,n), to avoid damage that may be caused by incorrect power being input to the power level identification circuit 10b.

In one embodiment, in response to the received power of the power level identification circuit 10b not meeting the power needs of the at least one function module 11n (n=1,2, . . . ,n), the processing unit 103 selectively turns off at least one of the at least one function module 11n (n=1,2, . . . ,n), to keep the power level identification circuit 10b in a normal working state. The power level identification circuit 10b switches between different modes to correspond to different levels of the received power, to avoid the risk of power supply shortage. Such modes can be, or include, the above-described modes corresponding to different levels of the second signals indicating power level.

In one embodiment, the signal level coding unit 205 codes the power output by the second voltage conversion unit 201, and generates the first signals indicating power level according to predetermined coding rules. Each of the signal level coding unit 205 and the data transference unit 106 comprises one item selected from the group consisting of a single chip microcomputer (SCM), a micro control unit (MCU), a programmable logic device (PLD), a complex programmable logic device (CPLD), and a field programmable gate array (FPGA).

The foregoing disclosure of various embodiments has been presented for the purposes of illustration. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto and their equivalents.

What is claimed is:

1. A power level identification circuit with different modes corresponding to different power levels, the power level identification circuit comprising:
   a power interface, which receives electrical power and first signals indicating a level of the power;
   a voltage conversion unit, connected to the power interface, the voltage conversion unit receiving the power from the power interface and converting the power;
   a waveform detection unit, connected to the power interface, the waveform detection unit filtering the power and obtaining the first signals indicating power level;
   a signal pre-processing unit, connected to the waveform detection unit, the signal pre-processing unit shaping waveforms of the first signals indicating power level and thereby generating second signals indicating power level; and
   a processing unit, connected to the signal pre-processing unit, the processing unit identifying a level of the second signals indicating power level and switching to one of the modes of the power level identification circuit corresponding to the identified level of the second signals indicating power level.

2. The power level identification circuit of claim 1, wherein the power level is a predetermined measurable parameter of the electrical power, and comprises at least one item selected from the group consisting of power level measurable in watts, current level measurable in amps, and voltage level measurable in volts.

3. The power level identification circuit of claim 1, further comprising a data transference unit connected between the signal pre-processing unit and the processing unit, wherein the data transference unit receives and stores the second signals indicating power level, and the processing unit reads the second signals indicating power level from the data transference unit.

4. The power level identification circuit of claim 3, further comprising a pre-stored power level encoded signal library, wherein the processing unit searches for the level of the second signals indicating power level from the pre-stored power level encoded signal library to identify the level of the second signals indicating power level.

5. The power level identification circuit of claim 3, wherein the data transference unit comprises one item selected from the group consisting of a single chip microcomputer (SCM), a micro control unit (MCU), a programmable logic device (PLD), a complex programmable logic device (CPLD), and a field programmable gate array (FPGA).

6. The power level identification circuit of claim 1, further comprising a pre-stored power level encoded signal library, wherein the processing unit searches for the level of the second signals indicating power level from the pre-stored power level encoded signal library to identify the level of the second signals indicating power level.

7. The power level identification circuit of claim 1, wherein in response to the processing unit not identifying the level of the second signals indicating power level, the processing unit suspends working of the power level identification circuit.

8. The power level identification circuit of claim 1, wherein the waveform detection unit comprises a zener diode with an anode connected to the signal pre-processing unit and a cathode connected to a node between the voltage conversion unit and the power interface.

9. The power level identification circuit of claim 1, wherein the signal pre-processing unit shapes the waveforms of the first signals indicating power level such that the second signals indicating power level accurately correspond to the first signals indicating power level.

10. The power level identification circuit of claim 1, wherein the signal pre-processing unit comprises:
    a photoelectric sensor with an input connected to the waveform detection unit, and an output connected to the processing unit; and
    a resistor, connected between the input of the photoelectric sensor and the waveform detection unit.

11. The power level identification circuit of claim 1, further comprising at least one function module; wherein when the processing unit switches to the one of the modes, the processing unit turns on or turns off the at least one function module according to the one of the modes; and in response to the power interface not receiving the first signals indicating power level, the processing unit turns off the at least one function module.

12. The power level identification circuit of claim 11, wherein the at least one function module comprises at least one power over Ethernet (PoE) function module.

13. A power level flag circuit, comprising:
 a voltage conversion unit;
 a power interface, connected to the voltage conversion unit, the power interface receiving electrical power from the voltage conversion unit;
 a signal level coding unit, connected to the voltage conversion unit, the signal level coding unit identifying a level of the power output by the voltage conversion unit, and generating signals indicating the level of the power;
 a first isolation unit, connected between the power interface and the voltage conversion unit, the first isolation unit isolating the signals indicating power level in the power interface so that the voltage conversion unit can supply the power via the power interface; and
 a second isolation unit, connected between the signal level coding unit and the power interface, the second isolation unit isolating the power in the power interface so that the signal level coding unit can transmit the signals indicating power level via the power interface.

14. The power level flag circuit of claim 13, wherein the power level is a predetermined measurable parameter of the electrical power, and comprises at least one item selected from the group consisting of power level measurable in watts, current level measurable in amps, and voltage level measurable in volts.

15. The power level flag circuit of claim 13, wherein the signal level coding unit generates the signals indicating power level according to predetermined coding rules of the power.

16. The power level flag circuit of claim 13, wherein the first isolation unit comprises a diode with an anode connected to the voltage conversion unit and a cathode connected to the power interface.

17. The power level flag circuit of claim 13, wherein the second isolation unit comprises a capacitor with a first end connected to the signal level coding unit and a second end connected to a node between the power interface and the fist isolation unit.

18. The power level flag circuit of claim 13, wherein the signal level coding unit comprises one item selected from the group consisting of a single chip microcomputer (SCM), a micro control unit (MCU), a programmable logic device (PLD), a complex programmable logic device (CPLD), and a field programmable gate array (FPGA).

19. A power level supply system, comprising:
 a power level identification circuit with different modes corresponding to different power levels, the power level identification circuit comprising:
  a first power interface, which receives electrical power and first signals indicating a level of the power;
  a first voltage conversion unit, connected to the first power interface, the first voltage conversion unit receiving the power from the first power interface and converting the power;
  a waveform detection unit, connected to the first power interface, the waveform detection unit filtering the power and obtaining the first signals indicating power level;
  a signal pre-processing unit, connected to the waveform detection unit, the signal pre-processing unit shaping waveforms of the first signals indicating power level and thereby generating second signals indicating power level; and
  a processing unit, connected to the signal pre-processing unit, the processing unit identifying a level of the second signals indicating power level and switching to one of the modes of the power level identification circuit corresponding to the identified level of the second signals indicating power level; and
 a power level flag circuit, comprising:
  a second voltage conversion unit;
  a second power interface, connected to the first power interface and the second voltage conversion unit, the second power interface receiving the power from the second voltage conversion unit;
  a signal level coding unit, connected to the second voltage conversion unit, the signal level coding unit identifying a level of the power output by the second voltage conversion unit, and generating the first signals indicating power level;
  a first isolation unit, connected between the second power interface and the second voltage conversion unit, the first isolation unit isolating the first signals indicating power level in the second power interface so that the second voltage conversion unit can supply the power via the second power interface; and
  a second isolation unit, connected between the signal level coding unit and the second power interface, the second isolation unit isolating the power in the second power interface so that the signal level coding unit can transmit the first signals indicating power level via the second power interface.

* * * * *